United States Patent [19]

Archer

[11] 4,342,956
[45] Aug. 3, 1982

[54] PROPORTIONAL BASE DRIVE CIRCUIT

[75] Inventor: William R. Archer, Ft. Wayne, Ind.

[73] Assignee: General Electric Company, Salem, Va.

[21] Appl. No.: 219,736

[22] Filed: Dec. 23, 1980

[51] Int. Cl.³ .......................................... H03K 17/04
[52] U.S. Cl. ..................................... 323/289; 307/300
[58] Field of Search .................. 307/253, 296 R, 297, 307/300; 323/282, 287, 289; 363/20, 21, 131, 133, 134

[56] References Cited

U.S. PATENT DOCUMENTS

| 3,541,420 | 11/1970 | Rees | 323/287 X |
| 3,610,963 | 10/1971 | Higgins | 307/253 X |
| 3,657,569 | 4/1972 | Froeschle | 307/275 |
| 3,983,418 | 9/1976 | Wallace | 323/289 X |
| 3,986,052 | 10/1976 | Hunter | 323/289 X |
| 4,178,521 | 12/1979 | Speth | 307/270 |

FOREIGN PATENT DOCUMENTS

| 2604387 | 7/1977 | Fed. Rep. of Germany | 307/300 |
| 503364 | 4/1976 | U.S.S.R. | |

OTHER PUBLICATIONS

Norton, "Turnoff Circuit", IBMTDB, vol. 7, No. 6, Nov. 1964, p. 428.
Fugere et al., "Transformer-Coupled Storage Charge Removal", IBMTDB, vol. 14, No. 6, Nov. 1971, p. 1691.
Palmucci, "Switching Regulator with Transistor Turn-off", IBMTDB, vol. 16, No. 4, Sep. 1973, p. 1161.
Leung, "Power Transistor Switch", IBMTDB, vol. 11, No. 2, Jul. 1968, p. 210.

Primary Examiner—A. D. Pellinen
Attorney, Agent, or Firm—James J. Beusse; Arnold E. Renner

[57] ABSTRACT

An improved proportional base drive circuit for rapidly and efficiently switching a high current bipolar transistor includes a transformer having first and second serially connected windings coupled in a load current path between the emitter terminal of the transistor and a load. A base terminal of the transistor is connected to a junction intermediate the two windings by a base bias circuit. The turns ratio between the two windings is selected to force a proportional base current to flow to the transistor. A third winding is provided, along with switching apparatus for exciting the third winding, whereby conduction of the load transistor can be initiated by energizing the third winding. A diverter circuit connected to the third winding allows rapid removal of current from the base of the load transistor for fast turn-off. In an alternative embodiment, a fourth winding is arranged to provide a driving current for more rapid forcing of current from the base drive circuit at turn-off.

8 Claims, 2 Drawing Figures

PROPORTIONAL BASE DRIVE CIRCUIT

BACKGROUND OF THE INVENTION

This invention relates generally to transistor base drive circuits and more specifically to a transistor base drive circuit for rapidly and efficiently switching a high current bipolar load transistor.

The advent of high current transistors capable of switching hundreds of amperes at high voltages has led to the development of improved switching mode power conditioners such as inverters, battery chargers, chopper circuits and the like. By fabricating switching mode power conditioners of such high current transistors in place of conventional four layer or pnpn semiconductor switching devices such as thyristors, switching mode power conditioner efficiency can be improved and power conditioner cost and size can be reduced.

To obtain good switching mode power conditioner performance, it is necessary that each power conditioner transistor turn-off quickly, that is to say, that each transistor be rendered rapidly conductive and nonconductive, respectively. This requires that the transistor base drive circuit closely regulate transistor base drive current. Ideally, a base drive circuit should supply the transistor with a large, fast rising pulse of base current to rapidly render the transistor conductive. Once the transistor is rendered conductive and becomes saturated, sufficient but not excessive base drive current should be supplied to maintain transistor saturation thus necessitating that the transistor base drive circuit supply the transistor with base drive current proportional to transistor collector current. To effect rapid substantial nonconductivity of the transistor once transistor turn-off has been initiated, the base drive circuit should reverse bias the transistor base with respect to the transistor emitter.

Heretofore, various base drive circuits have been proposed to effect rapid transistor switching. A common prior-art proportional base drive circuit comprises a transformer having a primary winding and first and second secondary windings. Typically, the first secondary winding of the transformer is coupled across the base-emitter junction of a bipolar load transistor and the second secondary winding is coupled in series with either the collector or the emitter of the load transistor. Initially, with the primary of the transformer energized such that the rate of change of flux in the primary is zero, no current is induced in either secondary winding, and thus the load transistor remains nonconductive. When the primary winding is deenergized, causing a change in magnetic flux, current is induced in the first secondary winding, causing the load transistor to become conductive and current to pass through the second secondary winding of the transformer. The current in the second secondary winding causes an opposite polarity current to be induced in the first secondary transformer winding, thus causing transformer base current to be proportional to transistor load current, that is, the current through the collector-to-emitter portion of the transistor. When the transformer primary winding is re-energized, a current opposite in direction to load transistor base drive current is induced in the first secondary transformer winding, causing load transistor base drive current to decrease to zero, thereby rendering the transistor nonconductive.

While such prior art base drive circuits maintain transistor saturation, once the transistor saturation is reached, by supplying the transistor with base drive current proportional to transistor load current, such prior art base drive circuits do not achieve rapid load transistor turn-off. This is because, after the transformer secondary winding is de-energized, the transformer secondary winding maintains decreasing conduction of load transistor base current, causing the load transistor to briefly remain conductive even after de-energization of the transformer primary.

In contrast, the present invention concerns an improved proportional base drive circuit for rapidly switching a high current bipolar load transistor.

BRIEF SUMMARY OF THE INVENTION

It is an object of the present invention to provide a base drive circuit for rapidly switching a high current bipolar load transistor.

It is a further object of the present invention to provide a base drive circuit for rapidly switching a high current bipolar load transistor notwithstanding load transistor conduction duration.

It is yet another object of the present invention to provide a base drive circuit which supplies a high current bipolar load transistor with base drive current proportional to transistor collector current.

Briefly, in accordance with the preferred embodiment of the invention, an improved base drive circuit for rapidly and efficiently switching a high current bipolar load transistor comprises a transformer having at least three windings. The transformer first and second windings are coupled in series between the emitter terminal of a load transistor and a load. A junction mediate the first and second winding is coupled to the load transistor base junction by a diode and parallel capacitor and supplies the load transistor with base drive current proportional in magnitude to transistor load current, i.e., the current through the load transistor collector-emitter portion. Circuit means are coupled to the third winding of the transformer for pulse energizing the transformer first winding during intervals when the bipolar switching transistor is to become conductive and another circuit means coupled to the third winding for de-energizing the transformer first winding during intervals other than when the bipolar switching transistor is to be conductive. A capacitor, coupled to the first winding and to the load transistor base terminal, stores energy during intervals when the load transistor is conductive. During intervals when the load transistor is turned off, energy from the energy storage capacitor is supplied to the first winding and to the base and emitter of the load transistor to maintain the load transistor in a non conducting state.

In a further embodiment the transformer includes a fourth winding connected in series with a controllable switch across a low voltage source. Control means operable in synchronism with the turn-off circuit means energizes the controllable switch means to apply the potential of the low voltage source across the fourth winding to accelerate the rate of change of current in the first winding.

Preferably the control means includes a current transformer having a primary winding which is in series with the load transistor and a secondary winding which is connected to supply energizing current to the controllable switch means in response to a turn-off command signal. Termination of conduction of the transistor thus removes energizing current from the current transformer to allow the controllable switch to re-open.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

DETAILED DESCRIPTION OF THE INVENTION

Figure 1:
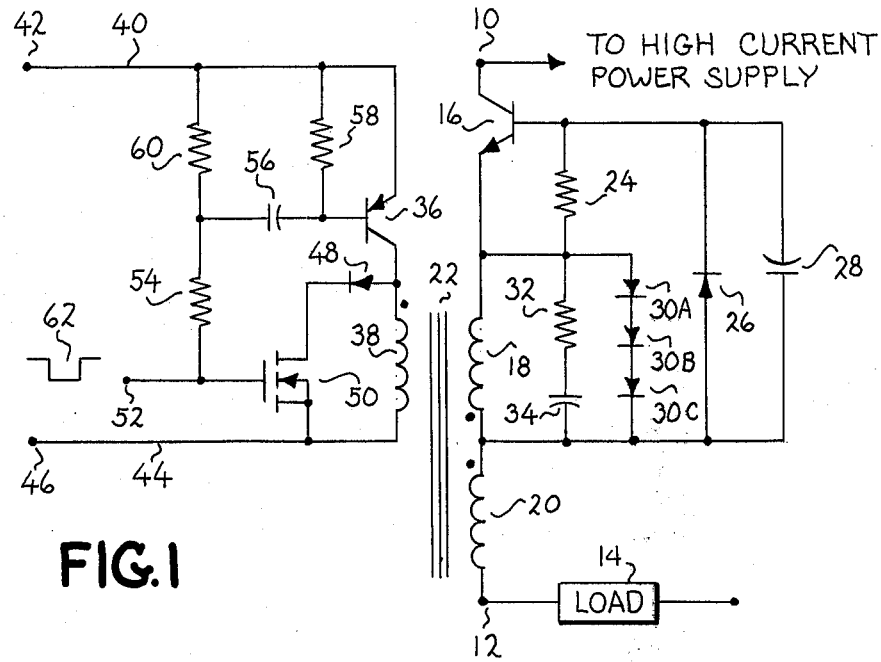
FIG. 1 is a schematic representation of one form of a proportional base drive circuit according to the present invention.

Referring now to FIG. 1 there is shown one form of the present invention as applied to a circuit designed to provide a controlled switching action between a pair of terminals 10 and 12. The switching circuit could be used as the switching element in various types of converters, but is particularly applicable for power converters operating in the ultrasonic region, i.e., 20 kilohertz or higher. The switching circuit illustrated in FIG. 1 is used in a single element power converter circuit. The terminal 10 is connected to a positive voltage terminal of a high magnitude direct current (DC) power supply (not shown) and the terminal 12 is connected to one terminal of a load 14, the other terminal of the load 14 being connected to a negative voltage terminal of the high magnitude DC power supply. The switching circuit comprises a power npn bipolar transistor 16 having a collector terminal connected to the terminal 10 and an emitter terminal connected to the terminal 12 through first and second windings 18 and 20 of a transformer 22. The windings 18 and 20 are tightly coupled as by being bifilar wound on the magnetic core of the transformer 22.

A resistor 24 connects a base terminal of the transistor 16 to its emitter terminal. The base terminal of transistor 16 is also connected to a junction intermediate windings 18 and 20 by a diode 26 and a capacitor 28 connected in parallel to the diode 26. A reverse voltage clamping circuit comprising diodes 30A, 30B and 30C is connected across the winding 18. It will be appreciated that a zener diode or other appropriate device could be substituted for the diodes 30 or that more or less diodes could be used as desired. A voltage suppression circuit comprising series connected resistor 32 and capacitor 34 also shunts the winding 18.

The switching circuit thus far described serves to provide proportional base drive current to the transistor 16 once it has been gated into conduction. In order to gate the transistor 16 into conduction and to turn it off as desired, there is provided a switching circuit comprising bipolar pnp transistor 36 and a third winding 38 wound on transformer 22. An emitter terminal of the transistor 36 is connected to a DC bus 40, which DC bus 40 is connected via a terminal 42 to a relatively positive voltage terminal of a low current power supply (not shown). A collector terminal of the transistor 36 is connected to one end of the winding 38 and a second end of the winding 38 is connected to a DC bus 44 which in turn is connected to a relatively negative voltage terminal of the low current power supply via the input terminal 46. The turn-off circuit for transistor 16 more specifically includes a diode 48 serially connected with a drain-source terminal of a field effect transistor (FET) 50 across the winding 38 whereby winding 38 can be short-circuited when desired. A gate terminal of the field effect transistor 50 is connected to a signal input terminal 52. The signal input terminal 52 is also connected to a base terminal of the transistor 36 via a differention circuit comprising a resistor 54 and serially connected capacitor 56. A resistor 58 is connected between the emitter terminal and the base terminal of transistor 36, and an additional resistor 60 is connected between the bus 40 and the junction intermediate capacitor 56 and resistor 54. Resistors 60 and 54 are utilized in conjunction with capacitor 56 to gate transistor 36 into conduction whereas resistor 58 insures that transistor 36 turns-off after a very short conduction time period.

In the operation of the circuit of FIG. 1, starting from the off condition of transistor 16, a negative going pulse, with reference to the negative bus 44 illustrated at 62, is applied to the gating terminal 52. The pulse 62 lowers the potential on the gate terminal of FET 50 thereby assuring that FET 50 is in the off condition while at the same time providing a discharge path for the capacitor 56 through the resistor 54. The resulting current from capacitor 56 through the resistor 54 pulls the base terminal of transistor 36 towards a negative voltage thereby causing transistor 36 to become conductive. With transistor 36 conducting the voltage appearing between the respective busses 40 and 44 is impressed across the transformer winding 38. Because of the relative values of the capacitor 56 and its associated resistors, the gating pulse actually applied to the transistor 36 is of a relatively short duration, e.g., approximately one microsecond. This short conduction time of transistor 36 assures that there is relatively low power dissipated in the transistor.

The voltage developed across the winding 38 is coupled via transformer action to the windings 18 and 20 of transformer 22. As indicated by the conventional dot symbology, the ends of the windings 18 and 20 at their common junction both develop a positive voltage with respect to their opposing ends. Since the transistor 16 is not yet in conduction, the current path through winding 20 is open circuited and no current will flow through that winding. However, the winding 18 has one current path through capacitor 34 and resistor 32 and also a second current path through diode 26 and capacitor 28 and through the base-emitter junction of transistor 16. The voltage developed across winding 18 forces a current to flow through diode 26 and capacitor 28 into the base terminal of transistor 16 plus bringing transistor 16 into conduction. The external high current power supply connected to terminal 10 then forces a current to flow through the conducting transistor 16, the winding 18, the winding 20 and load 14 back to the power supply.

The current flowing through the transistor 16 and windings 18 and 20 may vary widely depending upon the external circuit demands reflected by the load 14. Transformer 22 is configured so as to function as a current transformer. Winding 20 must carry the full current passing through the transistor 16 and load 14. Assuming for purposes of description that 10 amperes is flowing through winding 20 and that winding 20 has 8 turns whereas winding 18 has only 6 turns, it will be apparent that the current flowing through winding 20 represents 80 ampere-turns of drive. Since the transformer action demands that there always be balanced ampere-turns and since the winding 38 is essentially open circuited withe FET 50 turned off, the balancing ampere-turns must occur in the winding 18. Thus, 80 ampere-turns must be provided in the six turns of winding 18, therefore requiring that 13.3 amperes of current circulate through this winding. The difference between the 13.3 amperes flowing in winding 18 and the 10 amperes flowing in winding 20 represents the current which must flow through the base emitter junction of transistor 16 via diode 26. The transient suppression circuit comprising resistor 32 and capacitor 34 draws a negligible pulse of current and resistor 24 is of sufficient magnitude as to represent an insignificant current path.

It will be appreciated that the current supplied to the base of transistor 16 is directly proportional to the magnitude of collector current. Accordingly, if the collector current increases the base drive current also increases in direct proportion. The transistor 16 is therefore provided with a base drive current which is proportional to the collector current and is arranged such that the magnitude of the base drive current is only as large as is actually required to supply the desired collector current. The forced gain of the transistor is determined by the turns ratio selected for the windings 20 and 18 of the transformer 22. With the turns ratio as described in the above example, the forced gain of the transistor is three.

When it is desired to turn the transistor 16 off, i.e., to render it non-conductive, the signal 62 applied to the terminal 52 is allowed to revert to a positive voltage with respect to bus 44 and effectively to open circuit the terminal 52 so that the voltage applied from bus 40 through resistors 60 and 54 will pull the gate terminal of the FET 50 to a positive potential thus gating FET 50 into conduction. The voltage rise at terminal 52 also forces a "reset" of the capacitor 56 so that transistor 36 is held firmly non-conductive. Conduction of FET 50 results in a short circuit via diode 48 across winding 38. With a short circuit placed across the winding 38, the ampere turns required by winding 20 to balance the ampere turns ratio in the transformer 22 are supplied by the winding 38. Accordingly, the current flowing through winding 18 rapidly decays to zero. Reducing the current in winding 18 to zero effectively reduces the emitter current of transistor 16 to zero. However, the bipolar transistor 16 exhibits a storage time characteristic producing a delay of actual turnoff caused by stored charge in the collector-base junction of the transistor. With the emitter current reduced to zero, the collector current must flow in the collector and out the base terminal of the transistor 16. The effect of forcing the collector current through the collector base junction is to rapidly sweep the charge from the collector base junction and affect very rapid turnoff of the transistor 16. This type of switching is known as emitter switching and with some types of transistors will produce extremely fast total switch times, in the order of several hundred nanoseconds. A detailed discussion of emitter switching is given in U.S. Pat. No. Re. 29,788 by Anderson et. al., reissued Sept. 26, 1978, and assigned to the General Electric Company.

With some bipolar transistors an undesireable tailing effect will be exhibited during turnoff. The normal means for reducing or preventing this tailing effect is to remove the stored charge slower. This can be accomplished in the present invention by altering the physical coupling between the transformer windings 18 and 38. Altering the physical coupling such as by moving the position of the windings on a core, varies the leakage inductance between the windings such that the rate of transfer of current from winding 18 to winding 38 is varied. Accordingly, the design of the circuit can be tailored to produce a wide range of switching performance.

Once the stored charge has been completely swept out of the collector base junction of the transistor 16, transistor 16 becomes non conductive and collector current drops to zero. Since the current flowing through winding 20 cannot change as rapidly as the current flowing through transistor 16, due to the magnetic energy stored in the core of transformer 22, this stored energy in the magnetic field of transformer 22 forces current to continue flowing and generates a voltage such that all undotted ends of the winding 18 20 and 38 become positive with respect to their dotted ends. Diode 48 blocks current flow through winding 38 and winding 20 is open circuited because of the open circuit condition of transistor 16. Thus, all the energy in the magnetics of transformer 22 must now flow through winding 18 and, in this instance, flows around the loop formed by the diode 30. The diode 30 serves to clamp the voltage across the winding 18 to a predetermined value. The resistor 32 and series connected capacitor 34 act as a snubber to control excessive ringing of the voltage on the winding 18. Once the magnetic energy in transformer 22 has been dissipated and the voltage across the winding 18 has fallen to zero, the circuit stabilizes with a voltage charge on capacitor 28 of such a polarity as to maintain the base-emitter junction of transistor 16 in a reversed bias condition. This reverse bias condition improves the noise immunity in the circuit and also reduces high temperature leakage currents which may occur in the transistor. The resistor 24 serves to define a base-emitter impedance when the transistor 16 is forced to be off for long periods of time.

Figure 2:
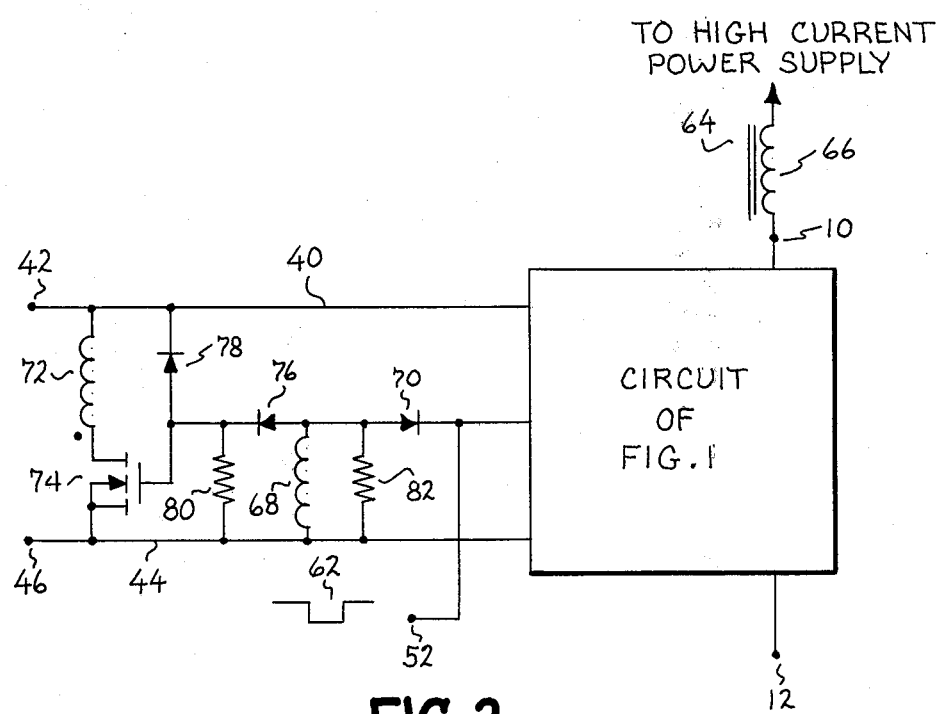
FIG. 2 is a schematic representation of a preferred form of proportional base drive circuit according to the present invention.

Although the circuit illustrated in FIG. 1 has been successfully demonstrated, it is occasionally required in higher frequency designs to provide for more rapid switching of the power transistor 16. Because there is a practical limit as to how low the leakage inductance between windings 18 and 38 can be made and because there is a practical limit on the rate with which emitter current can be reduced towards zero, it may not be possible to achieve the desired speed with the circuit of FIG. 1. Referring now to FIG. 2 there is shown a still further improvement in switching regulators which permits higher frequency of operation and more rapid turnoff of the switching transistor 16. In order to simplify the illustration, the circuit of FIG. 1 has been indicated as a block with the additional components required to enhance the operation of the circuit added externally to the block. The terminal numbers in FIG. 2 correspond to the terminal numbers used in FIG. 1.

A small magnetic current transformer 64 has a primary winding 66 which is inserted between the terminal 10 and the high current power supply. A secondary winding 68 of the transformer 64 is serially connected with a diode 70 between the terminal 52 and relatively negative DC bus 44. The transformer 64 is preferably selected to have a transfer ratio of approximately 100:1 so that for every ampere of current flowing into the terminal 10, there is approximately ten milliamperes of current flowing in the secondary winding 68. Also added is an additional winding 72 on the transformer 22.

The winding 72 is serially connected through an FET switch 74 between the low voltage DC busses 40 and 44. A gate terminal of the FET 74 is connected through a diode 76 to the terminal of winding 68 to which is also connected diode 70. The gate terminal of FET 74 is also connected to the DC bus 40 by a diode 78 and to the DC bus 44 via a resistor 80. A bleeder resistor 82 to is also connected in parallel with the winding 68.

With the transistor switch 16 is in a nonconducting mode, there is no current flowing through the primary winding 66 of transformer 64 and consequently no current is developed in the secondary winding 68. During this time the FET 74 is held in an off condition and the additional circuit of FIG. 2 does not utilize any power. Furthermore, because the additional circuitry of FIG. 2 utilizes current through the primary winding 66 to perform its functions, the circuit does not affect turn on of the transistor 16. However, with the transistor switch 16 in conduction, a current is generated in winding 68. If the voltage applied to terminal 52 is in a low condition thereby indicating that it is desired to have transistor 16 in conduction, the current generated in winding 68 will flow through the diode 70 and out the terminal 52. When the voltage signal at terminal 52 rises either to a higher voltage potential as indicated by the waveform 62 or if the terminal 52 is open circuited, the current generated in winding 68 will immediately transfer to the path through the diode 76 to the gate terminal of FET 74, thereby gating FET 74 into conduction.

When the FET 74 is gated into conduction, the voltage appearing between bus 40 and bus 44 is immediately applied across the winding 72, which winding is an added secondary on the base drive transformer 22. The winding 72 is wound on the core of the transformer 22 in such a manner that the applied voltage across the winding attempts to reverse the current in the transformer winding 18. This action causes the rate of change of current in winding 18 to be greatly increased. Accordingly, the time required to reduce the emitter current to zero is significantly shortened.

It should be noted that as soon as the transistor switch 16 ceases conducting, the current drive provided by the winding 68 immediately ceases. This action removes the gate drive from FET 74 and permits the gate capacitance to discharge through the resistor 80. The circuit will then revert to its non-dissipative state.

It will be appreciated by those skilled in the art that what has been described is a high reverse drive system which automatically tracks the requirements of the power switching device. Variations in the stored charge from transistor to transistor or within the same transistor caused by temperature or collector current variations are monitored and tracked by the disclosed circuit. Excess reverse drive, which would dissipate large amounts of power in the circuit and would also tend to increase the transient energy stored in the core of the transformer 22, is avoided and only the amount of drive required to perform the function is provided.

Although a preferred embodiment of the present invention has been described in detail, those skilled in the art will appreciate that certain modifications and variations of this embodiment may be made without materially departing from the novel and advantageous features of the invention. Accordingly, all such variations and modifications are intended to be included within the scope of this invention as defined by the appended claims.

What is claimed is:

1. In a circuit for repetitively switching a bipolar transistor between conducting and non-conducting states at a relatively high frequency switching rate, the switching transistor being connected to a relatively high magnitude direct current source and being controlled by switching signals from a relatively low voltage magnitude current source, an improved proportional base drive circuit comprising:
   a transformer having at least first, second and third windings, said first and said second windings being connected in series with a collector and an emitter terminal of the transistor between the high magnitude current source and a load, at least said first winding having a first end thereof connected to the emitter terminal of the transistor;
   means for connecting a base terminal of the transistor to a second end of said first winding;
   first controllable switch means serially connected with said third winding across said low voltage magnitude source; and
   second controllable switch means connected across said third winding, whereby closing said first switch means causes a magnetizing current to flow through said third winding thereby exciting said first and second windings to initiate conduction of the transistor, and closing of said second switch means short circuits said third winding and thereby effectively open-circuits the emitter terminal of the transistor forcing collector current through the collector-base junction to effect a rapid turn-off of the transistor.

2. The base drive circuit of claim 1 and including:
   a fourth winding on said transformer;
   third controllable switch means serially connected with said fourth winding across said low voltage magnitude source; and
   control means operable in synchronism with said second switch means for closing said third switch means whereby the potential of said low voltage magnitude source is placed across said fourth winding to thereby accelerate current decay in said first winding.

3. The base drive circuit of claim 1 or 2 wherein said first and said second windings are serially connected to said emitter terminal of the transistor.

4. The base drive circuit of claim 1 or 2 wherein said connecting means comprises:
   a diode connected from said second end of said first winding to said base terminal of the transistor and poled to conduct base drive current;
   a first capacitor connected in parallel with said diode for maintaining a reverse bias on said base terminal when the transistor is non-conductive;
   a base bias resistor connected from said emitter to said base terminal;
   a transient voltage suppression circuit including a resistor and a second capacitor connected in series across said first winding; and
   a voltage clamping means connected across said first winding for limiting the reverse voltage applied to the base-emitter junction of the transistor by said first winding.

5. The base drive circuit of claim 1 or 2 wherein said first switch means comprises:
   a bipolar transistor connected between one terminal of the low voltage magnitude source and said third winding;
   a control signal input terminal; and a voltage differentiation circuit for connecting said input terminal to a base terminal of said pnp transistor, said differentiation circuit operating to provide relatively short duration gating pulses to said transistor in response to control signals applied to said input terminal.

6. The base drive circuit of claim 1 or 2 wherein said second switch means comprises:

a field effect transistor having its drain and source terminals connected in a series circuit across said third winding; and means for coupling a control signal to a gate terminal of said field effect transistor for selectively rendering it conductive and non-conductive.

7. The base drive circuit of claim 2 wherein said third switch means comprises:

a field effect transistor having its drain and source terminals connected in a series circuit between said fourth winding and said low voltage magnitude source;

a stored charge bleed-off resistor connected between a gate terminal of said effect transistor and its drain terminal; and a diode connected from said gate terminal to one terminal of said low voltage magnitude source for limiting voltage at said gate terminal.

8. The base drive circuit of claim 7 wherein said control means comprises:

a current transformer having a primary winding and a secondary winding, said primary winding being serially connected in a current path with said second winding;

a first diode;

means connecting said secondary winding and said first diode in a series circuit between said gate terminal and said drain terminal of said field effect transistor;

a resistor connected in shunt with said secondary winding for absorbing inductive current when current ceases in said primary winding; a control signal input terminal; and a second diode interconnecting a junction mediate said first diode and said secondary winding to said control signal input terminal, whereby current in said secondary winding is coupled to said gate terminal of said field effect transistor in response to a signal applied to said control signal input terminal.

* * * * *